(12) United States Patent
Tomohiro et al.

(10) Patent No.: US 6,464,925 B1
(45) Date of Patent: Oct. 15, 2002

(54) METHOD OF POLARIZATION-TREATING PIEZOELECTRIC BODY

(75) Inventors: Hiroshi Tomohiro, Shiga-ken; Naoki Fujii, Omihachiman, both of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 48 days.

(21) Appl. No.: 09/638,043

(22) Filed: Aug. 12, 2000

(30) Foreign Application Priority Data

Aug. 13, 1999  (JP) .......................................... 11-228955

(51) Int. Cl.⁷ ................................................ H05B 6/00
(52) U.S. Cl. ........................ 264/435; 264/40.1; 264/436
(58) Field of Search ................................ 264/435, 436, 264/40.1

(56) References Cited

U.S. PATENT DOCUMENTS 4,999,819 A * 3/1991 Newnham et al. .......... 367/157
5,426,374 A * 6/1995 Taka et al. .................. 324/727

FOREIGN PATENT DOCUMENTS

JP          01-012587          1/1989

\* cited by examiner

*Primary Examiner*—Christopher A. Fiorilla
(74) *Attorney, Agent, or Firm*—Keating & Bennett, LLP

(57) ABSTRACT

A method of polarization-treating a piezoelectric body, which is constructed such that current flows through the piezoelectric body in response to application of a DC voltage to the piezoelectric body, includes the steps of measuring current flowing through the piezoelectric body, and stopping the application of the DC voltage at the time when the measured current value reaches a set level. The polarization degree is controlled based on the current value by utilization of a correlation between the current and the polarization degree during polarization. With this method, a desired polarization degree is obtained, and dispersion of the polarization is reduced.

20 Claims, 4 Drawing Sheets

METHOD OF POLARIZATION-TREATING PIEZOELECTRIC BODY

BACKGROUND OF THE INVENTION

1. Field of the Invention

The present invention relates to a method of polarization-treating a piezoelectric body for use in a ceramic filter, a ceramic oscillator, and other suitable devices.

2. Description of the Related Art

For polarization-treatment of piezoelectric ceramic substrates (block, unit, or other forms) of PZT and PT types, conventionally, after a piezoelectric ceramic substrate is fired, electrodes are provided on both of the opposite surfaces of the piezoelectric ceramic substrate. A plurality of piezoelectric ceramic substrates are simultaneously dipped into a polarization liquid at a temperature of 60° C. to 100° C., and a voltage of 2 kV/mm to 8 kV/mm is applied for about 10 to 30 minutes to obtain a desired polarization degree.

Polarization treatment of a piezoelectric body may be performed by in-liquid polarization which is carried out in a polarization liquid having insulation properties as described above, in-air polarization which is conducted in the atmosphere or in an gas atmosphere. In the in-air polarization, a desired electric field intensity can not be attained, since discharge occurs at a voltage of about 1 kV/mm or higher. For this reason, in general, the in-liquid polarization is carried out in order to obtain a high polarization degree.

However, in the case of the in-liquid polarization, the polarization degree of a piezoelectric body can not be measured during polarization. This is because the vibration of the piezoelectric body placed in the liquid is damped, due to the liquid, and the frequency characteristic can not be measured. For this reason, conventionally, the in-liquid polarization is a constant-time polarization in which the polarization is carried out for a predetermined time period. As a result, there arises the problem that the polarization degree can not be exactly controlled, causing the firing and composition of the piezoelectric body to be dispersed, which results in dispersion of the polarization degree.

In Japanese Patent No. 2656041, a polarization method includes measuring a piezoelectric constant (for example, electromechanical coupling coefficient K) during polarization, and the application of a voltage is stopped when the constant reaches the predetermined level which is decided by a correlation between the value K obtained immediately after the polarization is stopped and the stable value K obtained after a lapse of time. By this, dispersion of the polarization degree, caused by dispersion of materials and firing conditions, can be reduced. Accordingly, a piezoelectric body having constant qualities can be produced.

However, in the above-described method, it is necessary to determine the piezoelectric constant value based on the frequency during the polarization, which requires a long measurement time. Accordingly, when many piezoelectric bodies are simultaneously polarized, it is likely that over-polarization occurs due to a measurement lag.

Moreover, there arises the problem that it is necessary to provide an impedance analyzer, an AC signal source, an AC/DC separation circuit, a change-over circuit, and so forth in order to measure the piezoelectric constant during polarization, and the measuring device is complicated and is expensive.

SUMMARY OF THE INVENTION

To overcome the problems described above, preferred embodiments of the present invention provide a method of polarization-treating a piezoelectric body in which dispersion of the polarization degrees of respective piezoelectric bodies are greatly reduced, and a target polarization degree is attained very precisely.

Further, preferred embodiments of the present invention provide a method of polarization-treating a piezoelectric body in which over-polarization caused by a measurement lag is prevented.

According to a preferred embodiment of the present invention, a method of polarization-treating a piezoelectric body having the characteristic that current flowing through the piezoelectric body, caused by application of a direct current (DC) voltage to the piezoelectric body is increased, the method including the steps of applying a DC voltage to the piezoelectric body, measuring current flowing through the piezoelectric body caused by the application of the DC voltage, and stopping the application of the DC voltage at the time when the measured current value reaches a set level.

In the case where a piezoelectric body made of a material such as piezoelectric ceramics is polarized, as current flows through the piezoelectric body during the polarization, the current tends to be increased exponentially over time, as shown in FIG. 1, as an example.

One of the reasons for the current increase as shown in FIG. 1 is that with the progression of the polarization, the internal orientation of a crystal proceeds in the electric field direction, which causes the insulation resistance of the piezoelectric body to decrease over time, and the decrease of the insulation resistance causes the current value to increase. The current increase during the polarization appears more distinctly as the temperature becomes higher.

In the case of a piezoelectric body having current flowing through the piezoelectric body caused by the application of a DC voltage, is increased as shown in FIG. 1, the polarization degree of the piezoelectric body can be predicted based on the current value. In particular, since the current flowing through the piezoelectric body and the polarization degree have a high correlation, the polarization degree can be made to approach a target value by stopping the polarization at the time when the current value reaches a set level, and dispersion of the polarization degree can be reduced.

Moreover, it is unnecessary to measure the polarization degree (frequency characteristics) during polarization as conventionally required. It is only necessary to measure the current. Thus, the measurement time can be significantly shortened, and over-polarization, caused by measurement lag when many piezoelectric bodies are polarized, are prevented.

In addition, since it is unnecessary to measure the frequency during polarization, the apparatus for polarization according to preferred embodiments of the present invention is greatly simplified.

According to preferred embodiments of the present invention, either method of in-liquid polarization or in-air polarization may be used, since measurement of the frequency characteristics of a piezoelectric body is unnecessary.

FIG. 2 shows the variation of the polarization degree of a piezoelectric body in the steps ranging from polarization to aging to ordinary temperature restoration.

As seen in FIG. 2, the polarization degree increases to the maximum during the polarization, and is reduced by the aging, and is partially restored in the ordinary temperature restoration so as to be stabilized. The maximum polarization degree $\Delta f_1$ in the polarization and the maximum current value (current limit value) $i_L$ at the maximum polarization degree $\Delta f_1$ have a high correlation. Further, the maximum polarization degree $\Delta f_1$ and the stable polarization degree $\Delta f_2$ obtained after the ordinary temperature restoration have a high correlation. Accordingly, the current limit value $i_L$ and the stable polarization degree $\Delta f_2$ obtained after the ordinary temperature restoration have a high correlation. In the above example, the polarization degree of a piezoelectric body is determined based on the frequency difference $\Delta f$ between the resonance frequency fr and the anti-resonance frequency fa. A piezoelectric constant such as an electromechanical coupling coefficient K, a center frequency, or the like may be used to determine the polarization degree.

FIG. 3 shows a correlation between the current limit value $i_L$ in the polarization and the polarization degree $\Delta f_2$ obtained after the application to the aging to the ordinary temperature restoration, following the current value reaching the current limit value. The correlation was determined under the following conditions:

piezoelectric body: PZT block (thickness 8 mm)
   polarization voltage (inter-electrode voltage): 8.7 kV
   polarization temperature: 200° C.
   aging temperature: 200° C.

When the current values are expressed as the logarithmic values as shown in FIG. 3, it is seen that the current value (logarithmic value) and the polarization degree are substantially in proportion to each other in the range of the current limit value of about 2 mA to about 10 mA.

Preferably, the set level is determined based on a correlation between the polarization degree of the piezoelectric body obtained immediately before the application of the DC voltage is stopped and the stable polarization degree of the piezoelectric body obtained after the piezoelectric body is aged, and then, the temperature of the piezoelectric body is restored to an ordinary temperature, following the stop of the voltage application. Thus, the final polarization degree can be controlled at a target value very accurately.

For example, if a target final polarization degree $\Delta f=3.0$ kHz is desired, the polarization is stopped at the time when the current value becomes about 3.5 mA, and after aging, the temperature is restored to an ordinary temperature.

When the values of currents flowing through piezoelectric bodies are increased, voltage drop is generated in current limiting resistors which are provided for preventing over-current and are connected in series with the respective piezoelectric bodies, so that the voltages applied to the piezoelectric bodies are reduced, respectively. The reduction of the voltages causes the problems that the polarization rates of the piezoelectric bodies are reduced, and a desired polarization degree can not be obtained.

Accordingly, preferably, a voltage drop in a current limiting resistor is calculated based on a current value flowing through the piezoelectric body, and the voltage drop is added to an initial applied voltage.

That is, an applied voltage is determined according to the following calculation expression:

applied voltage=initial voltage+current value×current limiting resistance

By keeping constant the voltages applied to the respective piezoelectric bodies at any time, dispersion of the polarization degrees of the piezoelectric bodies, caused by dispersion of the applied voltages, can be solved. In this method, the polarization condition (voltage) can be kept constant, in addition to the control of the polarization degree. Therefore, dispersion of the polarization degree is further reduced.

Other features, elements, characteristics and advantages of the present invention will become apparent from the following detailed description of preferred embodiments thereof with reference to the attached drawings.

DETAILED DESCRIPTION OF PREFERRED EMBODIMENTS

Figure 4:
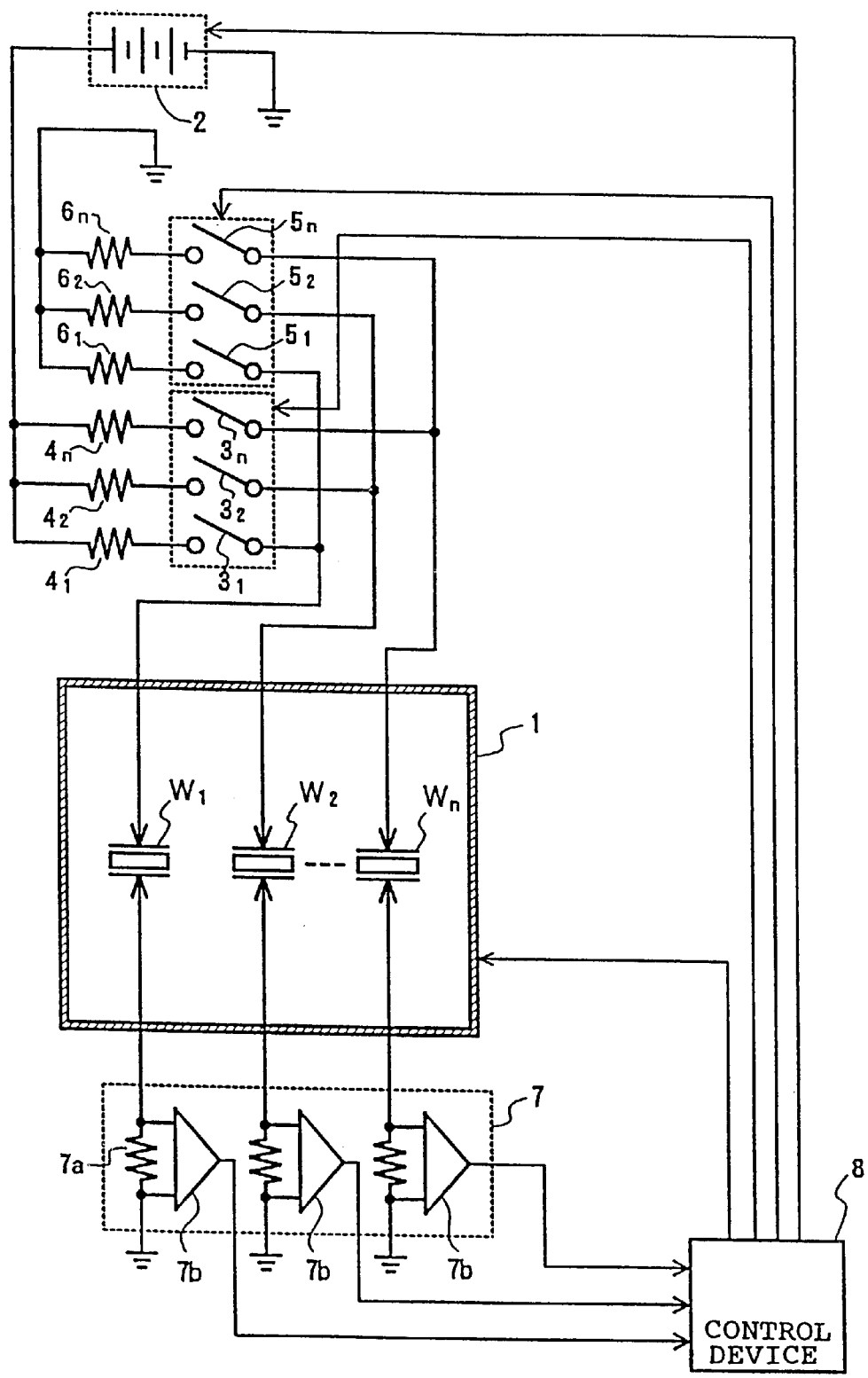
FIG. 4 is a circuit diagram of an example of a polarization treatment apparatus according to a preferred embodiment of the present invention.

FIG. 4 shows an example of a polarization treatment apparatus with which a method of polarization-treating a piezoelectric body of preferred embodiments of the present invention is carried out.

In FIG. 4, reference numerals $W_1$ to $W_n$ represent a plurality of piezoelectric bodies to be polarization-treated, respectively. The polarization treatment apparatus preferably includes a thermostat 1 for accommodating the plurality of piezoelectric bodies $W_1$ to $W_n$ and controlling an atmosphere at a predetermined temperature, a high voltage DC source 2 for polarization, high voltage change-over switches $3_1$ to $3_n$ for applying a voltage to the plural piezoelectric bodies $W_1$ to $W_n$, current limiting switches $4_1$ to $4_n$ for preventing over-current, discharge change-over switches $5_1$ to $5_n$ for discharging electric charges from the piezoelectric bodies $W_1$ to $W_n$, discharge resistors $6_1$ to $6_n$, a current detecting circuit 7 for detecting current through the piezoelectric bodies, and a control device 8 for controlling applied voltages and the polarization degrees.

In the thermostat 1, each treatment, that is, the polarization to the aging of the piezoelectric bodies $W_1$ to $W_n$ is carried out. The temperature of the thermostat 1 is controlled to be suitable for each treatment by the control device 8. The polarization temperature is preferably higher than an aging temperature (for example, 150° C. or higher) and to be a temperature at which a polarization degree that is comparable to that obtained by conventional in-liquid polarization can be attained. In the example, the conditions of the polarization to the aging were the same as those shown in FIG. 3.

The current detection circuit 7 preferably includes detection resistors 7a, and amplifiers 7b such as OP amplifiers for detecting potential differences between both ends of the respective resistors 11a, and detects currents flowing through the respective piezoelectric bodies $W_1$ to $W_n$, individually, based on the potential differences between both ends of the respective resistors 11a. The detection resistors 11a and the amplifiers 11b are connected to the piezoelectric bodies $W_1$ to $W_n$, respectively.

Current detection signals from the amplifiers 7b are input to the control device 8. The control device 8 controls the high voltage DC source 2, the high voltage change-over switch $3_1$ to $3_n$, the discharge change-over switches $5_1$ to $5_n$, and so forth, based on values of currents flowing through the piezoelectric bodies $W_1$ to $W_n$. The high voltage change-over switch $3_1$ to $3_n$ and the discharge change-over switches $5_1$ to $5_n$ are alternatively turned ON. During polarization, the high voltage change-over switch $3_1$ to $3_n$ are turned ON, and after the polarization, the discharge change-over switches $5_1$ to $5_n$ are turned ON.

Next, a polarization method using the polarization treatment apparatus having the above-described configuration will be described.

Figure 5:
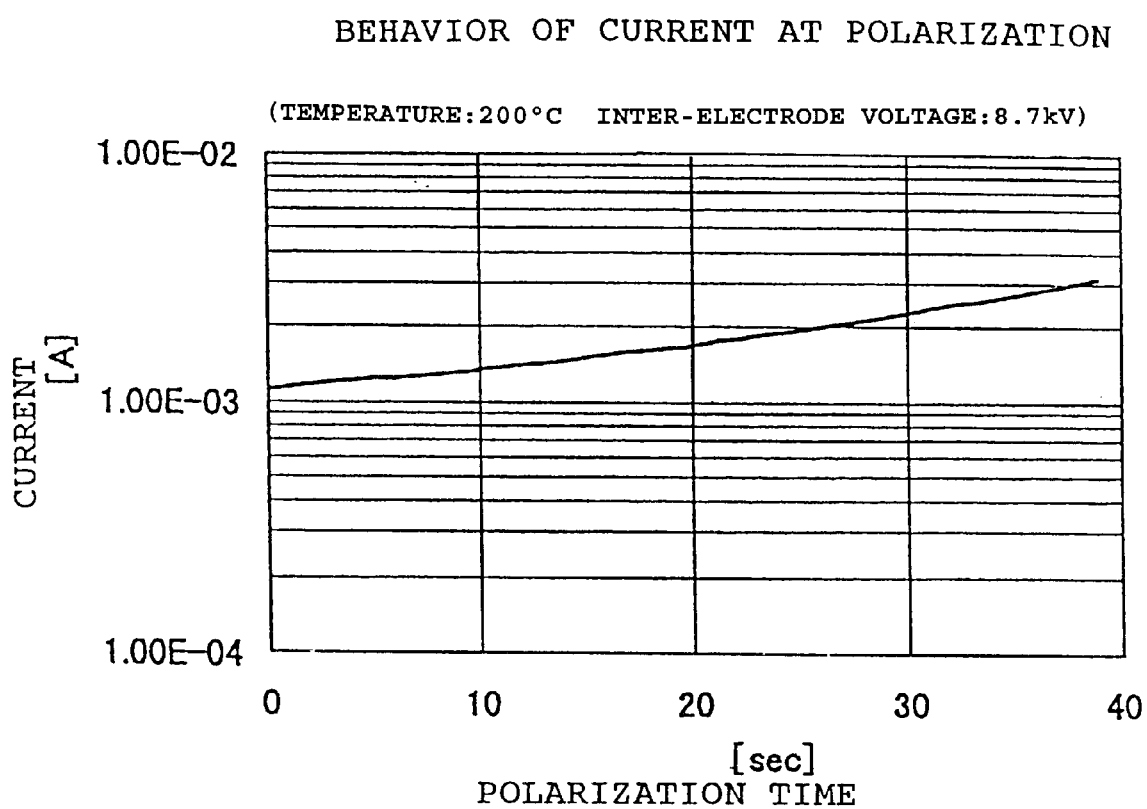
FIG. 5 is a graph showing variations in current during polarization.

First, the piezoelectric bodies $W_1$ to $W_n$ are placed in the thermostat 1. The temperature of the thermostat 1 is controlled so that all the piezoelectric bodies have a predetermined temperature (for example, about 200° C.). Next, the high voltage change-over switches $3_1$ to $3_n$ are turned ON, so that DC voltages for polarization are simultaneously applied to all the piezoelectric bodies $W_1$ to $W_n$, respectively. After the voltages start to be applied, the values of currents flowing through the respective piezoelectric bodies $W_1$ to $W_n$ are measured in the current detection circuit 7. The currents flowing through the respective piezoelectric bodies are increased over time as well as the polarization degrees as shown in FIG. 5.

Figure 1:
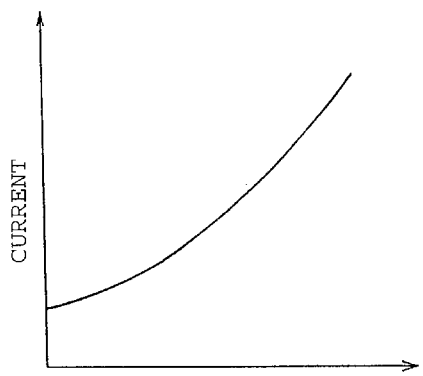
FIG. 1 is a graph showing the variation of current flowing through a piezoelectric body during polarization.
Figure 2:
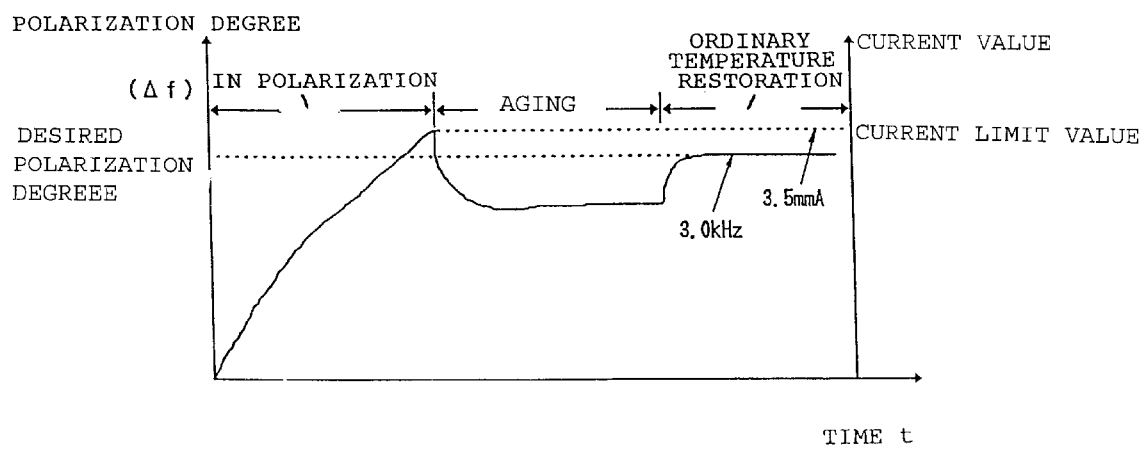
FIG. 2 is a graph showing the variation of the polarization degree during a polarization treatment process.
Figure 3:
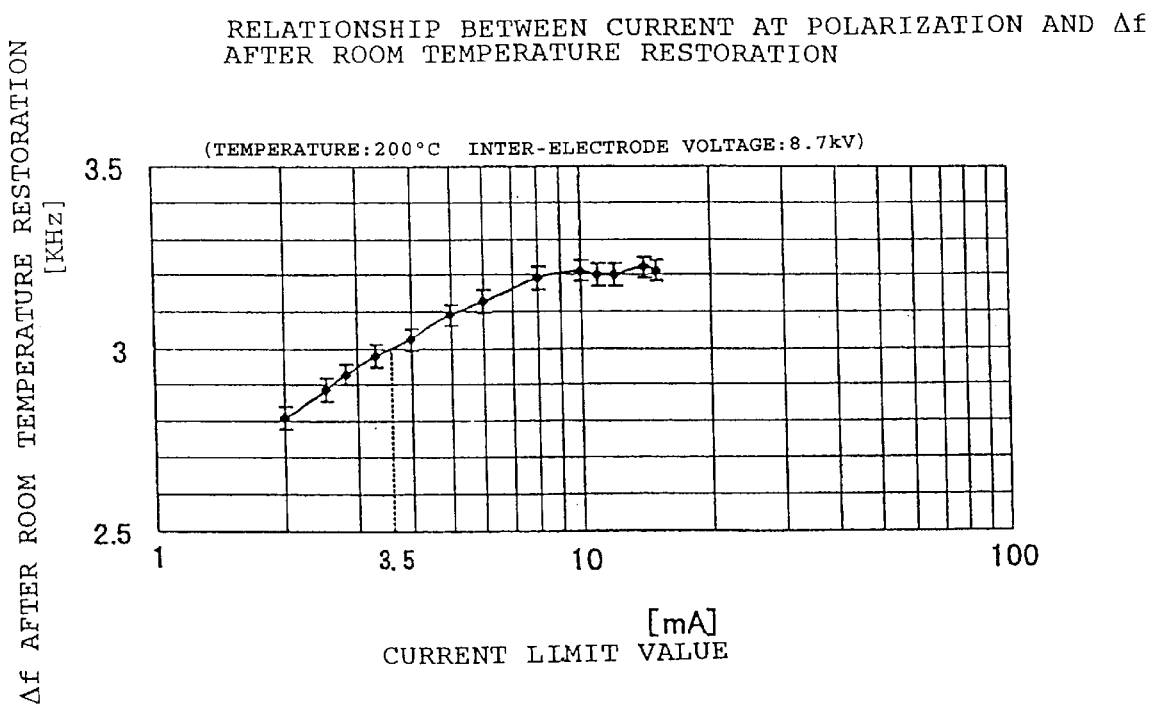
FIG. 3 is a graph showing a correlation between the current limit value in the polarization and the polarization degree obtained after room temperature restoration.

In the control device 8, current limit values $i_L$ having a high correlation with the stable polarization degrees $\Delta f_2$ obtained after the ordinary temperature restoration are preset. At the time when each current value during the polarization reaches the set value $i_L$, the control device 8 causes the high voltage change-over switches $3_1$ to $3_n$ to be OFF, individually, so that the application of the DC voltages to the piezoelectric bodies $W_n$ to $W_n$ is stopped, respectively. For example, as seen in FIG. 3, in order to obtain a target polarization degree $\Delta f=3.0$ kHz, the application of the voltage is stopped at the time when the current value $i_L$ during polarization reaches approximately 3.5 mA. In case where there is a piezoelectric body of which the current value has not reached the set value $i_L$ yet, the voltage application to the piezoelectric body is continued until the current value of the piezoelectric body reaches the set value $i_L$. Simultaneously when the voltage application is stopped, the control device 8 causes the discharge change-over switches $5_1$ to $5_n$ to be ON, so that charges stored in the piezoelectric bodies $W_1$ to $W_n$ are discharged. If the discharge is not carried out, an inverse electric field is applied, caused by the charges stored in the piezoelectric bodies $W_1$ to $W_n$. The polarization may be returned. After the discharge, the polarization is completed.

Next, the piezoelectric bodies $W_1$ to $W_n$ are aged in the thermostat 1 while the temperature of the piezoelectric bodies is kept at a predetermined temperature (for example, 200° C.) in the thermostat 1. The aging time may be approximately 2 or 3 minutes. During the aging, the discharge change-over switches $5_1$ to $5_n$ are kept in the ON state so that the discharge is continued. Thereafter, the piezoelectric bodies $W_1$ to $W_n$ are taken out from the thermostat 1, and the temperatures of the piezoelectric bodies $W_1$ to $W_n$ are restored to an ordinary temperature in a sufficient time (for example, 24 hours). Thus, the polarization treatment is completed.

The piezoelectric bodies $W_1$ to $W_n$ of which the polarization treatment is completed can be rendered a target polarization degree $\Delta f_2$.

When currents flowing through the piezoelectric bodies are increased over time during the polarization, voltage drop is generated in the current limiting resistors $4_1$ to $4_n$. Accordingly, the voltages across the electrodes at both ends of the respective piezoelectric bodies $W_1$ to $W_n$ are decreased. The voltage decrease causes the problem that the polarization rates of the respective piezoelectric bodies $W_1$ to $W_n$ are reduced, and a desired polarization degree can not be attained.

In the control device 8, the inter-electrode voltages of the piezoelectric bodies are controlled so as to be kept constant at any time by calculating the voltage drops in the current limiting resistors $4_1$ to $4_n$ based on current values detected by the current detection circuit 7, and adding the voltage drops to the initially applied voltages.

That is, each applied voltage is determined according to the following equation.

Applied voltage=initial voltage+current value×current limiting resistance

Dispersion of the polarization degrees of the piezoelectric bodies can be eliminated by keeping constant the voltages applied to the piezoelectric bodies at any time, respectively, as described above.

In the case where one applied voltage source 2 is provided, as shown in FIG. 4, in order to control the source voltage, the minimum values of currents flowing through the respective piezoelectric bodies may be used to control the source voltage. This is because the piezoelectric bodies are prevented from being broken down, due to application of an overvoltage. On the other hand, in the case where plural impressed-voltage sources are provided, for example, the impressed-voltages are calculated, based on current values of the respective piezoelectric bodies, and the voltages of the impressed-voltage sources are controlled for the piezoelectric bodies, respectively. The voltage control may be carried out by a feed back process conducted at any time when the current value is being increased.

In the above example, the polarization in the air is carried out at a high temperature. In preferred embodiments of the present invention, similarly, the in-liquid polarization can be carried out, since it is not necessary to measure the frequency characteristic of a piezoelectric body. Accordingly, it is possible to apply a higher DC voltage during polarization as compared with the in-air polarization.

Thus, according to preferred embodiments of the present invention, in the polarization treatment of a piezoelectric body having current flowing through the piezoelectric body caused by an applied DC voltage, the current is controlled at a set level by utilizing the correlation between the current during the polarization and the polarization degree. Therefore, the dispersion in polarization of piezoelectric bodies is greatly reduced.

In the current controlling method according to preferred embodiments of the present invention, the measurement time is significantly shortened as compared with a control method in which the frequency of a piezoelectric body is measured during polarization, and over-polarization, caused by measurement lag when plural piezoelectric bodies are polarization is prevented. This highly precise polarization control is achieved.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method of polarization-treating a piezoelectric body that is constructed such that current flows through the piezoelectric body in response to the application of a DC voltage to the piezoelectric body, the method comprising the steps of:

providing a piezoelectric body;

applying a DC voltage to the piezoelectric body;

measuring current flowing through the piezoelectric body caused by the application of the DC voltage; and stopping the application of the DC voltage when the measured current value reaches a set level.

2. The method according to claim 1, wherein said set level is determined based on a correlation between the current value of the piezoelectric body obtained immediately before the application of the DC voltage is stopped and the stable polarization degree of the piezoelectric body obtained after the application of the DC voltage is stopped.

3. The method according to claim 1, further comprising the step of aging the piezoelectric body.

4. The method according to claim 3, wherein the temperature during the polarization step is higher than the temperature during the aging step.

5. The method according to claim 3, further comprising the step of restoring the temperature of the piezoelectric body to an ordinary temperature.

6. The method according to claim 1, wherein in the step of applying the DC voltage, a voltage drop in a current limiting resistor is calculated based on a current value flowing through the piezoelectric body, and the voltage drop is added to an initial applied voltage.

7. The method according to claim 1, further comprising the step of providing a plurality of piezoelectric bodies and performing each of the steps of applying, measuring and stopping for the plurality of piezoelectric body at the same time.

8. The method according to claim 7, further comprising the step of controlling the temperature such that temperature of the plurality of piezoelectric bodies is substantially the same before the step of applying the voltage.

9. The method according to claim 1, wherein the step of applying the voltage is stopped at the time when the current value during polarization reaches approximately 3.5 mA.

10. The method according to claim 1, wherein the step of applying the voltage is performed such that the applied voltage is equal to the initial voltage plus the product of the measured current value and the current limiting resistance.

11. The method according to claim 1, wherein the piezoelectric body has electrodes thereon, the method further comprising the step of controlling the application of the voltage such that the voltage between the electrodes is kept constant.

12. A method of polarization-treating a piezoelectric body, the method comprising the steps of:

providing a piezoelectric body;

polarization-treating the piezoelectric body; and stopping the polarization treatment of the piezoelectric body based on a current flowing through the piezoelectric body that is generated in response to the polarization-treating of the piezoelectric body.

13. The method according to claim 12, wherein the step of polarization-treating includes the step of applying a DC voltage to the piezoelectric body.

14. The method according to claim 13, further comprising the step of measuring current flowing through the piezoelectric body caused by the application of the DC voltage.

15. The method according to claim 13, further comprising the step of setting a current limit and stopping the polarization treatment when the measured value of the current reaches the current limit.

16. The method according to claim 15, wherein said current limit is determined based on a correlation between the current value of the piezoelectric body obtained immediately before the application of the DC voltage is stopped and the stable polarization degree of the piezoelectric body obtained after the application of the DC voltage is stopped.

17. The method according to claim 13, wherein in the step of applying the DC voltage, a voltage drop in a current limiting resistor is calculated based on a current value flowing through the piezoelectric body, and the voltage drop is added to an initial applied voltage.

18. The method according to claim 12, further comprising the step of aging the piezoelectric body.

19. The method according to claim 18, wherein the temperature during the polarization step is higher than the temperature during the aging step.

20. The method according to claim 18, further comprising the step of restoring the temperature of the piezoelectric body to an ordinary temperature.

\* \* \* \* \*